United States Patent [19]
Petropoulos et al.

[11] Patent Number: 6,011,394
[45] Date of Patent: Jan. 4, 2000

[54] SELF-SHIELDED GRADIENT COIL ASSEMBLY AND METHOD OF MANUFACTURING THE SAME

[75] Inventors: Labros S. Petropoulos, Solon; Clarence E. Payton, Chagrin Falls; Michael A. Morich, Mentor; Gordon D. DeMeester, Wickliffe, all of Ohio

[73] Assignee: Picker International, Inc., Highland Heights, Ohio

[21] Appl. No.: 08/908,359

[22] Filed: Aug. 7, 1997

[51] Int. Cl.$^7$ ............................................. G01V 3/00
[52] U.S. Cl. ........................................ 324/318; 324/320
[58] Field of Search .................................. 324/318, 320, 324/319, 322, 307, 309, 300

[56] References Cited

U.S. PATENT DOCUMENTS

| | | | |
|---|---|---|---|
| 4,509,030 | 4/1985 | Vermilyea | 324/320 |
| 5,235,283 | 8/1993 | Lehne et al. | 324/318 |
| 5,289,128 | 2/1994 | DeMeester et al. | 324/318 |
| 5,296,810 | 3/1994 | Morich | 324/318 |
| 5,349,297 | 9/1994 | DeMeester et al. | 324/318 |
| 5,409,558 | 4/1995 | Takahasi et al. | 156/172 |
| 5,481,191 | 1/1996 | Rzedzian | 324/318 |
| 5,559,435 | 9/1996 | Harada | 324/318 |
| 5,572,131 | 11/1996 | Rzedzian | 324/322 |

*Primary Examiner*—Louis Arana
*Attorney, Agent, or Firm*—Fay, Sharpe, Fagan, Minnich & McKee, LLP

[57] ABSTRACT

A superconducting magnetic imaging apparatus includes a vacuum vessel (16) having a central helium reservoir (20) in which superconducting magnetic coil windings (12) are maintained at a superconducting temperature. The vacuum vessel defines an internal bore (22) within which a self-shielded gradient coil assembly (26) and an RF coil (30) are received. The self-shielded coil assembly includes a single former (50) which defines an imaging region (14) within which an imaged portion of a subject is received. Primary x, y, and z-gradient coils (72–76) are positioned over an RF ground screen (70) that is bonded to the former (50). A number of comb-like spacers (84) extend from the former to supporting shield x, y, and z-gradient coils (110–114). The comb-like spacers define passages between the primary and secondary gradient coils which receive inner and outer cooling tubes (90, 92) and shim tray molds (108). The fully assembled gradient coil assembly is potted to form a unitary structure in a single potting step. The shim tray molds are subsequently removed to define channels or pockets suitable for receiving shim trays (118).

21 Claims, 10 Drawing Sheets

SELF-SHIELDED GRADIENT COIL ASSEMBLY AND METHOD OF MANUFACTURING THE SAME

BACKGROUND OF THE INVENTION

The present invention relates to the magnetic resonance art. It finds particular application in conjunction with gradient coils for magnetic resonance imaging apparatus and will be described with particular reference thereto. However, it should be appreciated that the present invention may also find application in conjunction with magnetic resonance spectroscopy systems and other applications which utilize gradient magnetic fields.

In magnetic resonance imaging (MRI) applications, three orthogonal gradient fields are employed to provide spatial resolution by frequency discrimination of an MRI signal. A gradient coil set typically includes three discrete gradient coils for generating the x, y, and z-gradient fields. The coils are insulated from each other and are layered on a cylindrical former. Commonly, the entire gradient coil set is overwrapped and epoxy impregnated for greater structural strength to withstand the warping forces when the current carrying conductors of the coils interact with the primary magnetic field of an MRI apparatus.

The gradient coils are commonly pulsed with current pulses having a short rise time and a high duty cycle. Pulsing the gradient coils produces magnetic field gradients across the imaging region, as well as magnetic field gradients which interact with external metallic structures such as cold shields in a superconducting magnet. This interaction generates eddy currents in the cold shields, which, in turn, generate eddy magnetic fields. The eddy fields have a deleterious effect on the temporal and spatial quality of the magnetic field in the examination region, hence in the resultant image quality.

One approach for circumventing the eddy current problem is to place a secondary or shielding gradient coil set between the primary gradient coil set and the cold shields. The shielding gradient coil set substantially zeroes the magnetic field externally thereof, thus preventing the formation of eddy currents in the cold shields.

A unitary, self-shielded gradient coil assembly typically includes a secondary or shielding gradient coil set spaced radially outwardly of a primary gradient coil set and driven in series therewith. The primary and secondary gradient coil sets include insulated coils for generating x, y, and z-gradient fields which are layered on separate cylindrical formers. The primary and secondary gradient coil sets are individually overwrapped and epoxy impregnated for greater structural strength. A mechanical means typically connects the two formers together to form a unitary structure while maintaining the coil sets in a spaced relationship.

Typically, main superconducting magnets have bore diameters of least 90 cm and are at least 1.8 m in length. Magnets of such size can accommodate shielded gradient coil structures that are constructed from two separate formers (wherein each former has a thickness of approximately 5.0 to 7.5 cm) because there is adequate space between the predetermined patient aperture and the inside bore diameter of the magnet to accommodate such a radial build.

Reducing the diameter of the magnet bore dramatically reduces magnet costs. However, reducing the patient receiving bore reduces the utility of the MRI apparatus and its commercial acceptability.

In addition, known methods of manufacturing self-shielded gradient coil assemblies have a time-consuming, final alignment step. Alignment tooling and fixtures are used to ensure that the axial isocenter of the primary gradient coils coincide with the axial isocenter of the secondary gradient coils.

The present invention contemplates a new and improved self-shielded gradient coil assembly and method for manufacturing such a self-shielded gradient coil assembly which overcomes the above-referenced problems and others.

SUMMARY OF THE INVENTION

In accordance with one aspect of the present invention, there is provided a magnetic resonance imaging apparatus. The MRI apparatus includes a main field magnet for generating a temporally constant magnetic field through an examination region. A radio frequency transmitter excites and manipulates magnetic resonance in selected dipoles in the examination region. A receiver demodulates magnetic resonance signals received from the examination region. A processor reconstructs the demodulated resonance signals into an image representation. A self-shielded gradient coil assembly induces gradient magnetic fields across the temporally constant magnetic field. The self-shielded gradient coil assembly includes a former, primary gradient coils supported by the former, and a number of combs extending from the former for supporting shielding gradient coils.

In accordance with a second aspect of the present invention, there is provided a magnetic resonance imaging system. The MRI system includes an annular vacuum chamber which defines a cylindrical inner bore therein. An annular helium reservoir is disposed within the vacuum chamber and is surrounding and displaced from the central bore thereof. A superconducting primary magnetic field coil is disposed within the helium chamber for generating a substantially uniform magnetic field longitudinally through the central bore. A self-shielded gradient coil assembly is disposed in the central bore. The gradient coil generates gradient magnetic fields across a central region and shields the vacuum chamber, the helium reservoir, and other components within the vacuum chamber from the generated gradient field magnetic fields. Shielding blocks eddy currents from being induced in the vacuum chamber or the contained associated structure, which eddy currents would tend to generate spurious magnetic fields within the bore. The self-shielded gradient coil assembly includes a former received in and spaced from the bore. The former defines a subject receiving region therein for receiving a portion of a subject to be imaged. The self-shielded gradient coil assembly also includes primary x, y, and z-gradient coils mounted adjacent to the former for generating gradients across an examination region in the former. The self-shielded gradient coil assembly further includes a number of combs extending from the former for supporting secondary x, y, and z-gradient coils. The MRI imaging system also includes a radio frequency coil disposed within the vacuum chamber former. A scan controller selectively causes electrical pulses to be applied to the x, y, and z-primary gradient coils for inducing magnetic gradient pulses across the examination region. A radio frequency transmitter applies radio frequency pulses to the radio frequency coil for exciting and manipulating magnetic resonance of selected dipoles within the examination region. A receiver receives and demodulates magnetic resonance signals emanating from the examination region. A reconstruction mechanism reconstructs the demodulated magnetic resonance signals into an image representation.

In accordance with a third aspect of the present invention, there is provided a method of manufacturing a self-shielded gradient coil assembly. The method includes joining a number of primary gradient coils to a cylindrical former, joining a number of combs to the former, joining a number of shielding gradient coils to the combs to form a unitary structure, and potting the unitary structure.

In accordance with a fourth aspect of the present invention, there is provided a method of manufacturing a self-shielded gradient coil assembly. The method includes positioning a number of primary gradient coils over a cylindrical mandrel, positioning a number of combs over the cylindrical mandrel, joining a number of shielding gradient coils to the combs to form a unitary structure, potting the unitary structure, and separating the cylindrical mandrel from the unitary structure thereby forming a central patient receiving bore.

One advantage of the present invention is that it reduces the number of formers in a self-shielded gradient coil assembly.

Another advantage of the present invention resides in reduced cost.

Another advantage of the present invention is that the step of aligning a primary gradient coil set with a secondary gradient coil set is eliminated.

Another advantage of the present invention is that it minimizes stored magnetic energy consistent with gradient strength and uniformity requirements.

Further advantages reside in improved product quality, gradient strength, and slew rates.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
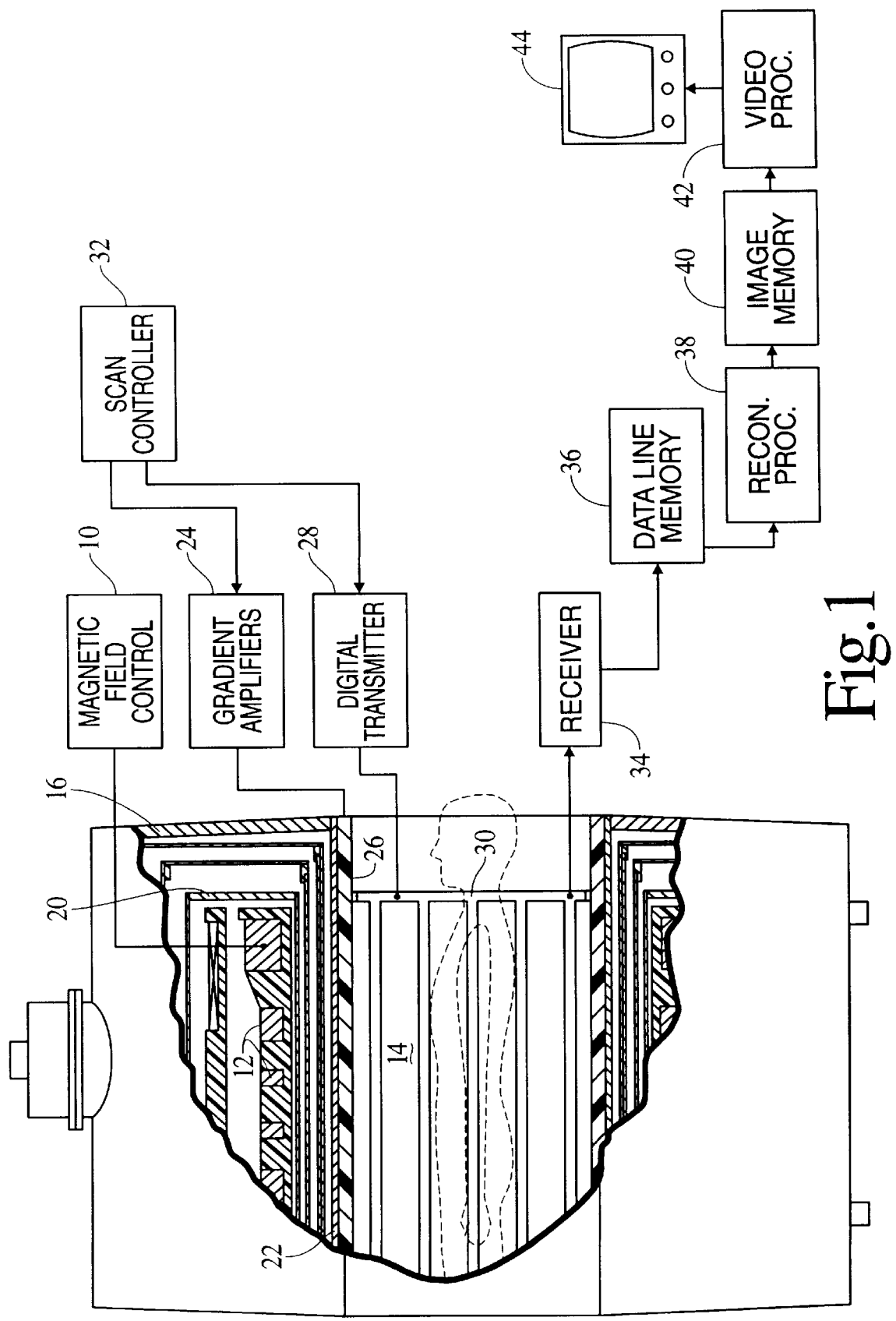
FIG. 1 is a diagrammatic illustration of a magnetic resonance imaging system having a self-shielded gradient coil assembly in accordance with a first embodiment of the present invention.

With reference to FIG. 1, a main magnetic field control 10 controls superconducting or resistive magnets 12 such that a substantially uniform, temporally constant magnetic field is created along a z-axis through an examination region 14. Preferably, a vacuum vessel 16 surrounds one or more cold shields 18 which surround a central helium reservoir 20 in which superconducting magnets 12 are maintained at a superconducting temperature. The vacuum vessel defines an internal bore 22.

A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences.

More specifically, gradient pulse amplifiers 24 apply current pulses to selected pairs of whole body gradient coils of a self-shielded gradient coil assembly 26 to create magnetic field gradients along x, y, and z-axes of the examination region 14. The gradient coil assembly 26 is positioned within the internal bore 22. A digital radio frequency transmitter 28 transmits radio frequency pulses to a whole body RF coil 30 to transmit RF pulses into the examination region. The RF pulses are used to saturate, excite resonance, invert magnetization, refocus resonance, or manipulate resonance in selected portions of the examination region. A scan or sequence controller 32 controls the gradient amplifiers and the digital receiver amplifies an imaging sequence, e.g. a fast spin echo sequence in which each resonance excitation or shot is followed by a plurality or train of echoes.

For whole body applications, the resonance signals are commonly picked up by the whole body RF coil 30 and demodulated by a receiver 34 to form data lines that are stored in a data line memory 36.

An image reconstruction processor 38 reconstructs the data set into an image representation that is stored in an image memory 40. A video processor 42 converts selected data from the image memory into an appropriate format for display as slices, three dimensional rendering and the like on a human-readable monitor 44.

Figure 2:
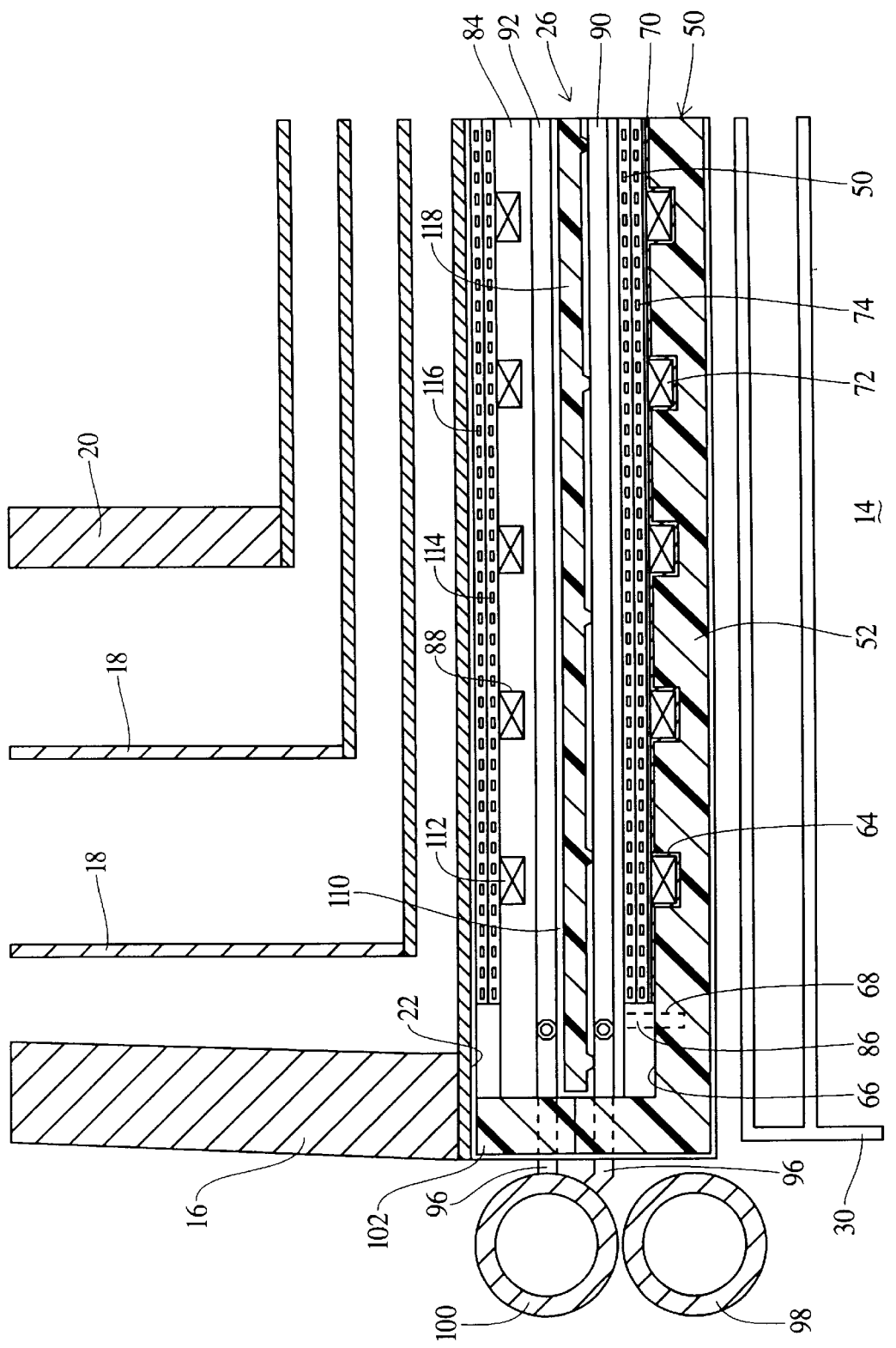
FIG. 2 is an enlarged fragmentary, sectional view of the self-shielded gradient coil assembly of FIG. 1.
Figure 3:
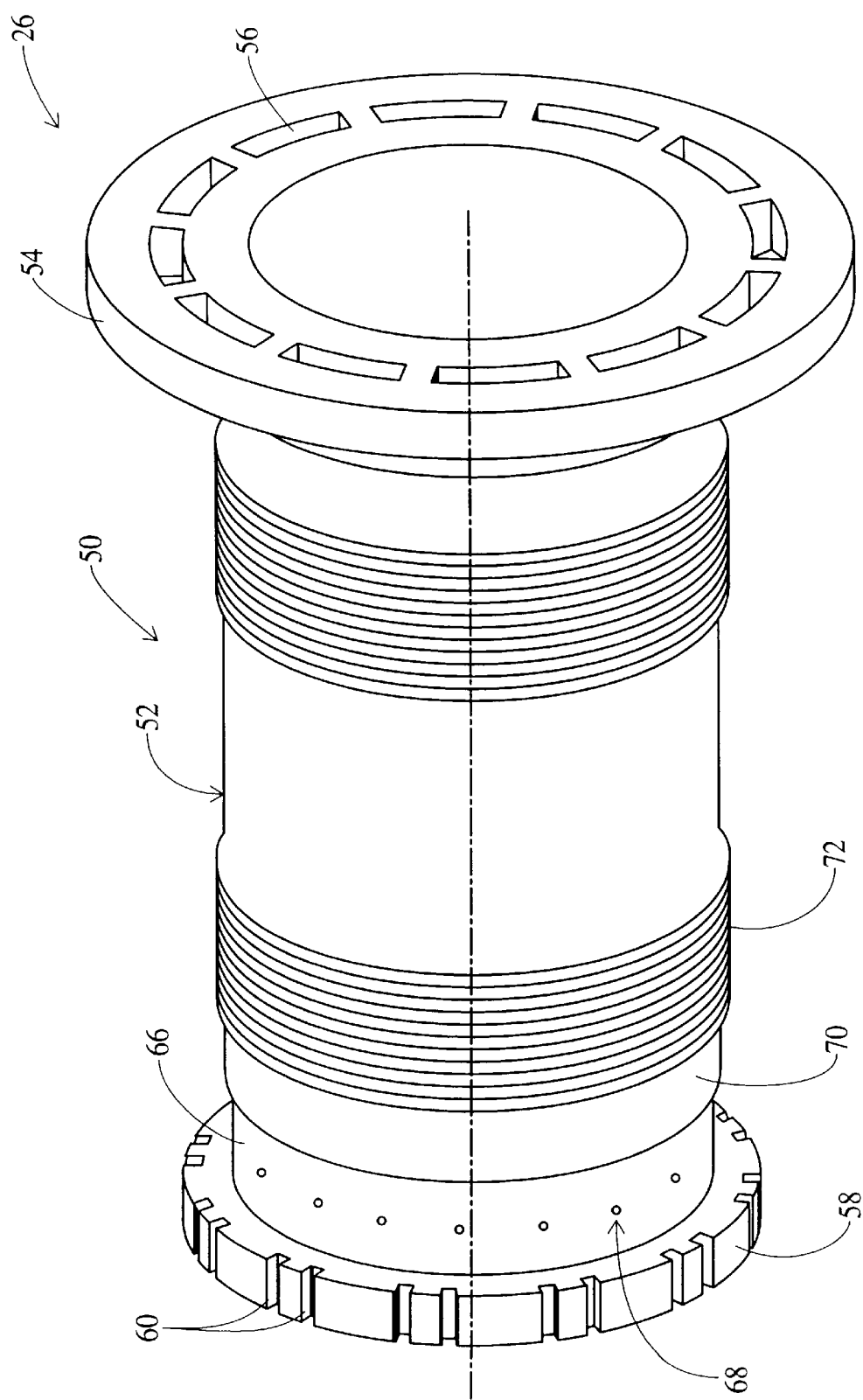
FIG. 3 is a perspective view of the self-shielded gradient coil assembly of FIG. 2, partially assembled with a primary z-gradient coil wound over an RF ground screen that is secured to a former.

Referring now to FIGS. 2 and 3, the self-shielded gradient coil assembly 26 includes an electrically insulating, hollow, right cylinder coil-form or former 50. In the embodiment being described, the former 50 includes is a glass filament wound resin tube (FWT) 52 and a first flange 54 extending transversely from a front or patient-end of the cylindrical portion 52. The first flange 54 includes a plurality of circumferentially spaced apertures 56 extending therethrough.

The former 50 also includes a second flange 58 extending transversely at a rear or service-end of the cylindrical portion 52. The second flange 58 includes a plurality of paired notches 60 circumferentially spaced along its outer surface. As best seen in FIG. 2, a plurality of axially spaced grooves 64 extend circumferentially around an outer surface 66 of the cylindrical portion 52. In addition, a plurality of radially-oriented, closed-end bores 68 (one shown) extend into the cylindrical portion 52 from the outer surface thereof.

In the embodiment being described, an integral RF ground screen 70 is bonded to the outer surface of the cylindrical portion 52 and urged into the axially-spaced grooves 64, as shown in FIG. 2. The RF ground screen 70 is preferably bonded to the former using a wet laying or a vacuum pressure impregnation process (VPI). The RF ground screen is preferably formed from phosphor and bronze materials which are matched to the slew rate design, as is known in the art. Alternatively, the RF ground screen can be mounted to the inner diameter of the former 50, or embedded with the filament windings in the tube defining the former.

A primary z-gradient coil 72 is wound into the grooves 64 over the RF screen 70. Optionally, the z-gradient coil is temporarily or spot bonded to the cylindrical portion 52. Alternatively, the z-gradient coil can be wound into the grooves 64 and the RF screen 70 can be bonded to the cylindrical portion 52 over the z-gradient coil. The embodiment being described incorporates a bunched primary z-gradient coil design. However, a distributed current coil design can also be utilized.

Figure 4:
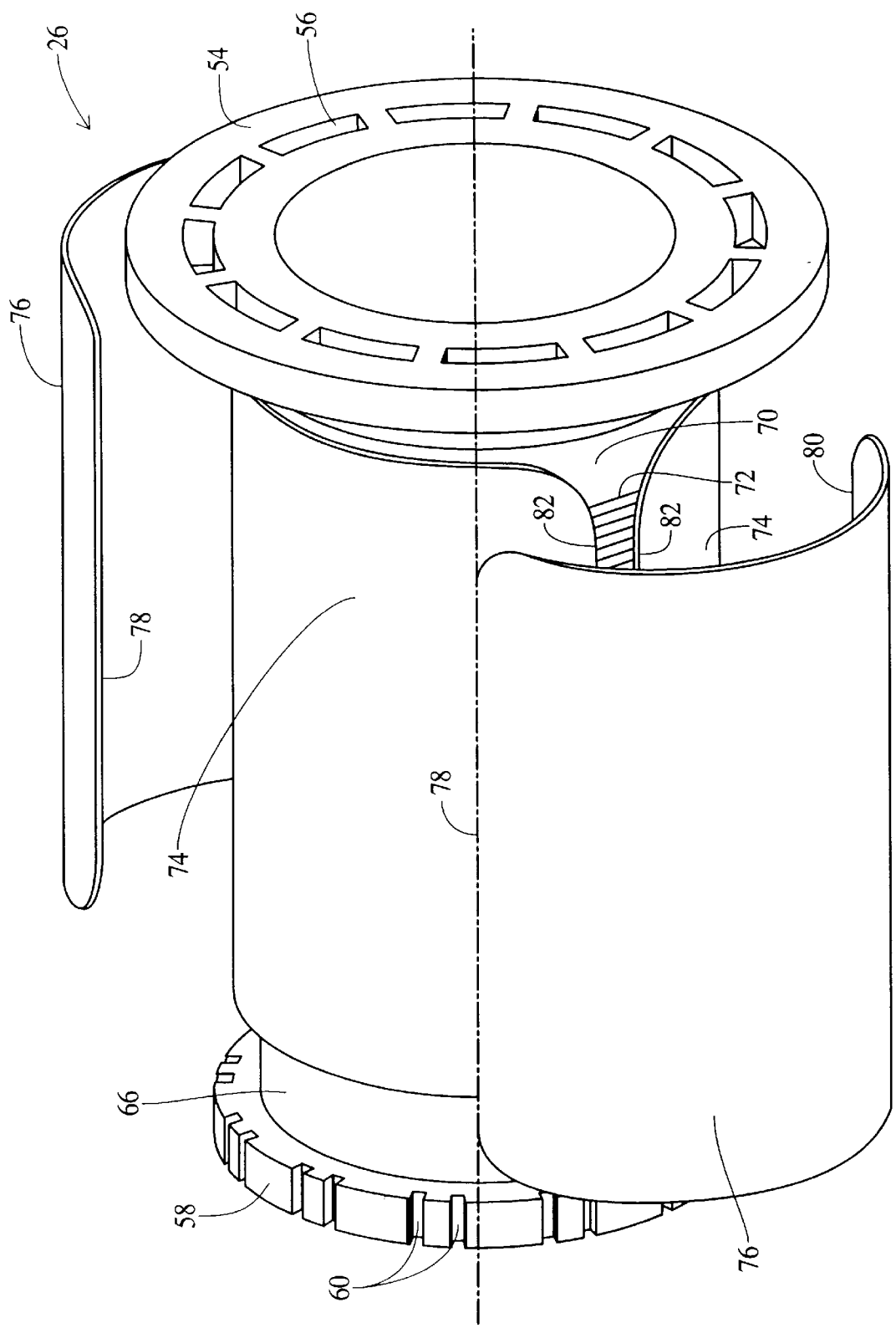
FIG. 4 is a perspective view of the self-shielded gradient coil assembly of FIG. 3 with a primary x-gradient coil secured over the z-gradient coil, and a primary y-gradient coil positioned over the x-gradient coil.

With continuing reference to FIG. 2 and particular reference to FIG. 4, a primary x-gradient coil assembly 74 is temporarily spot bonded to the gradient coil assembly 26 over the primary z-gradient coil 72. A primary y-gradient coil 76 is then temporarily spot bonded to the gradient coil assembly 26 over the primary x-gradient coil assembly 74. In the embodiment being described, the x- and y-gradient coil assemblies 74, 76 each include four (4) electric conductor distributed "thumbprint" quadrant windings (not shown) mounted in pairs on flexible dielectric sheets. For both gradient coils 74, 76, two of the quadrant windings are adjacent and extend around a first portion of the former, while the other two quadrant windings are adjacent and extend around a second portion of the former.

Thus, the x- and y-gradient coils 74, 76 are substantially equivalent to each other, but one of the gradient coils 74, 76 is circumferentially offset from the other gradient coil by approximately 90° relative to the central axis of the former. The quadrant winding sections of the y-gradient coils, are mounted around the x-gradient coil 74. The opposing edges 78 and opposing edges 80 (one shown) are positioned adjacent to each other around the former, such that the edges 78, 80 lie in a vertical (y, z) plane.

The quadrant winding sections of the x-gradient coil 74 are mounted around the z-gradient coil 72 with opposing edges 82 positioned adjacent to each other. The x-gradient coil 74 is circumferentially offset from the y-gradient coil 76 by 90°. For the x-gradient coil, the edges 82 and the opposite edges (not shown) lie in a horizontal (x, z) plane.

Figure 5:
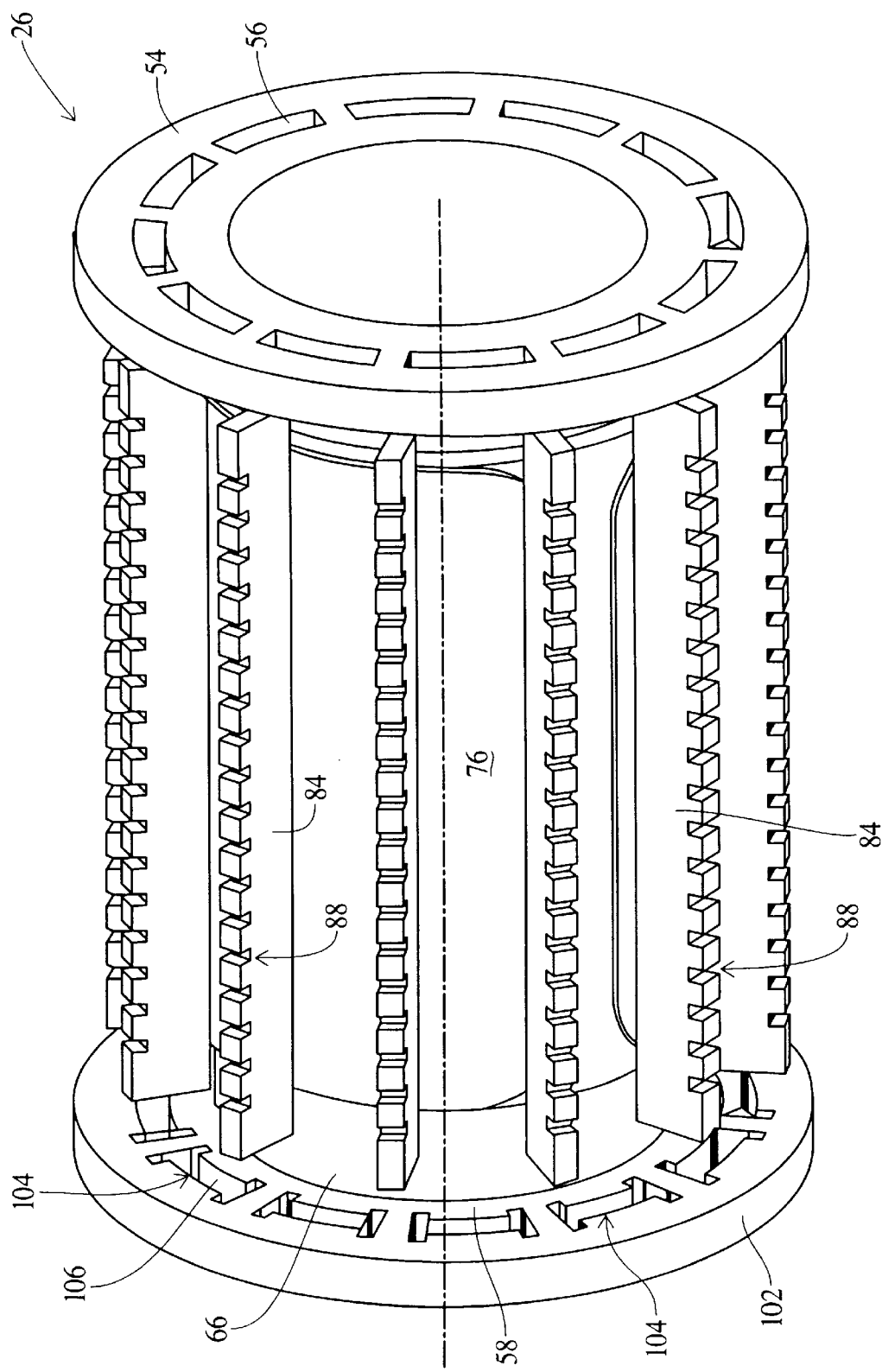
FIG. 5 is a perspective view of the self-shielded gradient coil assembly of FIG. 4 with a plurality of combs secured over the y-gradient coil, and a ring secured over a service-end flange.

With continuing reference to FIG. 2, and particular reference to FIG. 5, a plurality of circumferentially spaced-apart dielectric combs 84 are secured to the gradient coil assembly 26 over the y-gradient coil 76. Each of the combs 84 includes one or more pins 86 (FIG. 2) extending from a lower surface thereof into the apertures 68 of the former 50. Other mechanical mounting arrangements, such as slots in the end flanges, are also contemplated. The combs 84 also include a plurality of axially spaced notches 88 along their outer surfaces. In the preferred embodiment, the combs 84 are formed from a glass-resin composite material.

The combs 84 support the rest of the radial build-up of the gradient coil assembly 26 as described further below. Thus, it should be appreciated that the combs 84 replace the second filament wound tube or former associated with prior self-shielded gradient coil assemblies. In order to avoid aligning the primary and secondary (described below) gradient coil sets, the combs 84 (and hence the notches 88), as well as the tooling for forming the grooves 64, is located or positioned precisely relative to the machined surface of the flange 54. Thus, both primary and secondary coil sets are mechanically aligned within the machine tool tolerances.

Figure 6:
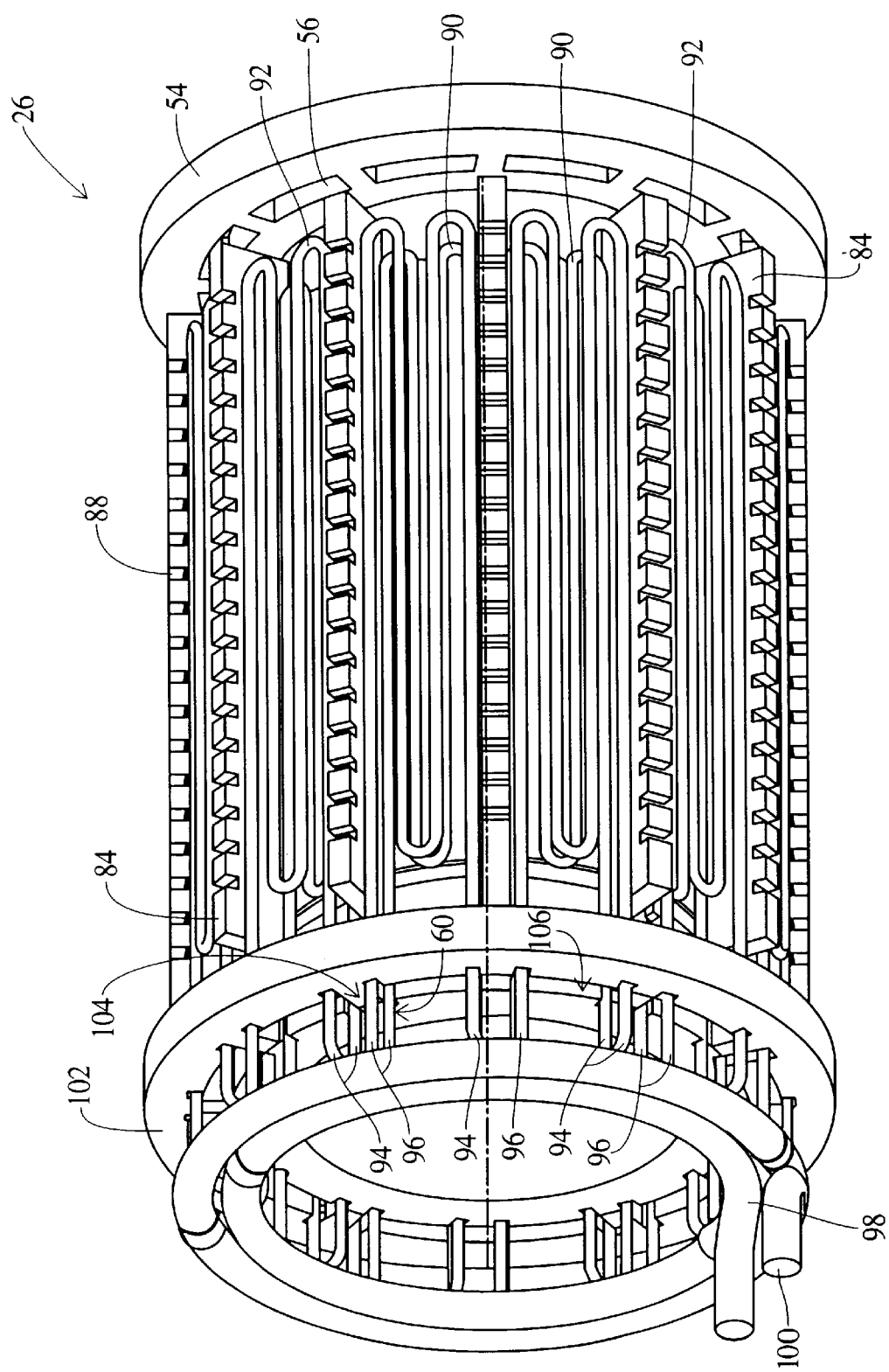
FIG. 6 is a perspective view of the self-shielded gradient coil assembly of FIG. 5 with inner and outer cooling tubes positioned between adjacent combs, and service-end coolant manifolds joined to free ends of the cooling tubes.

With continuing reference to FIG. 2, and particular reference to FIG. 6, an inner serpentine, e.g. M-shaped, cooling tube or heat exchanger 90 is spaced radially inward from an outer serpentine, e.g. M-shaped cooling tube or heat exchanger 92 between adjacent combs 84. Each of the cooling tubes 90, 92 is temporarily spot bonded to the gradient coil assembly 26.

Each of the cooling tubes 90, 92 includes an inlet 94 and an outlet 96. Each of the inlets 94 is joined to a single, circular, service-end coolant supply manifold 98; each of the outlets 96 is joined to a single, circular service-end coolant return manifold 100. In the embodiment being described, the cooling tubes 90, 92, and manifolds 98, 100 are seamless and are formed from stainless steel for heat strength and minimal magnetic susceptibility interference during imaging.

The inlets 94 and outlets 96 pass through the paired notches 60 on the service-end flange 58. After the cooling tubes are in place, a service-end ring 102 is then bonded over the flange 58 such that notches 104 associated with the service-end ring 102 align with the cooling tube inlets and outlets 94, 96. Further, when the service-end ring 102 is joined to the flange 58, apertures 106 are formed between adjacent pairs of notches 60 and 104. As described below, shim tray molds extend through the apertures 56 to form channels or pockets which extend axially through the gradient coil assembly 26 from the service-end to the patient receiving-end. The service-end ring 102 may be formed from one or more arcuate members which, when joined to the flange 58, form a substantially continuous circumference.

Figure 7:
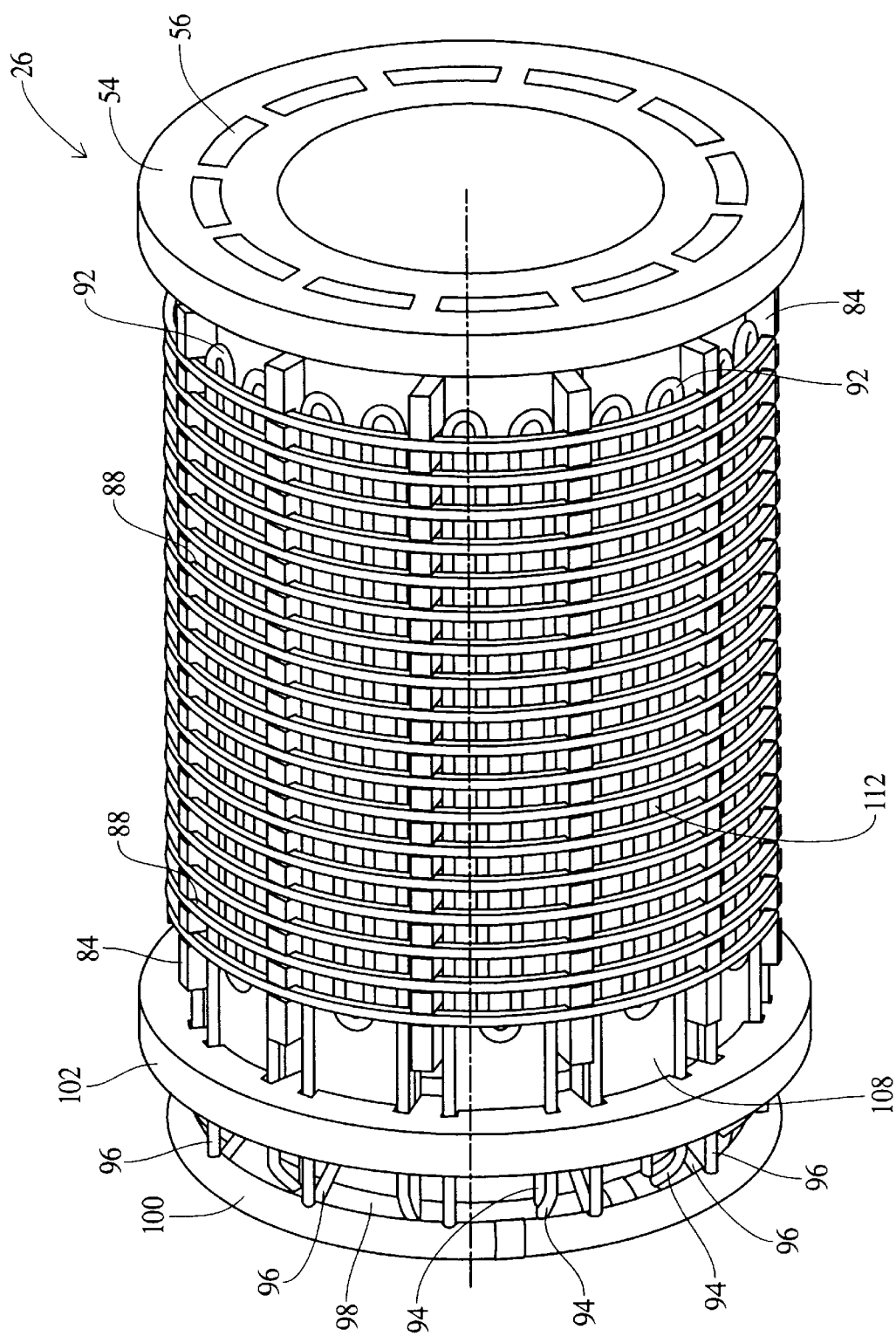
FIG. 7 is a perspective view of the self-shielded gradient coil assembly of FIG. 6 with a plurality of shim tray pockets positioned between the inner and outer cooling tubes, and a secondary z-gradient coil wound over the combs.

With continuing reference to FIG. 2, and particular reference to FIG. 7, a plurality of shim tray molds 108 are inserted through the apertures 56 of the flange 54 into the gaps between the inner and outer cooling tubes 90, 92 and through the apertures 106. Prior to insertion into the gaps, each mold 108 is wrapped with approximately three sheets of woven glass material to provide structural integrity around the resultant channel or pocket 110 (FIG. 2) that is formed when the molds 108 are subsequently removed following the single potting step described below.

The shim tray molds 108 may be solid and formed from a non-ferrous material such as aluminum, wax, etc. so as not to leave a ferrous residue when removed. The shim tray molds 108 have a highly polished surface with a taper of approximately 2 mm from end to end to facilitate removal through apertures 56 with a hydraulic removal apparatus.

Figure 8:
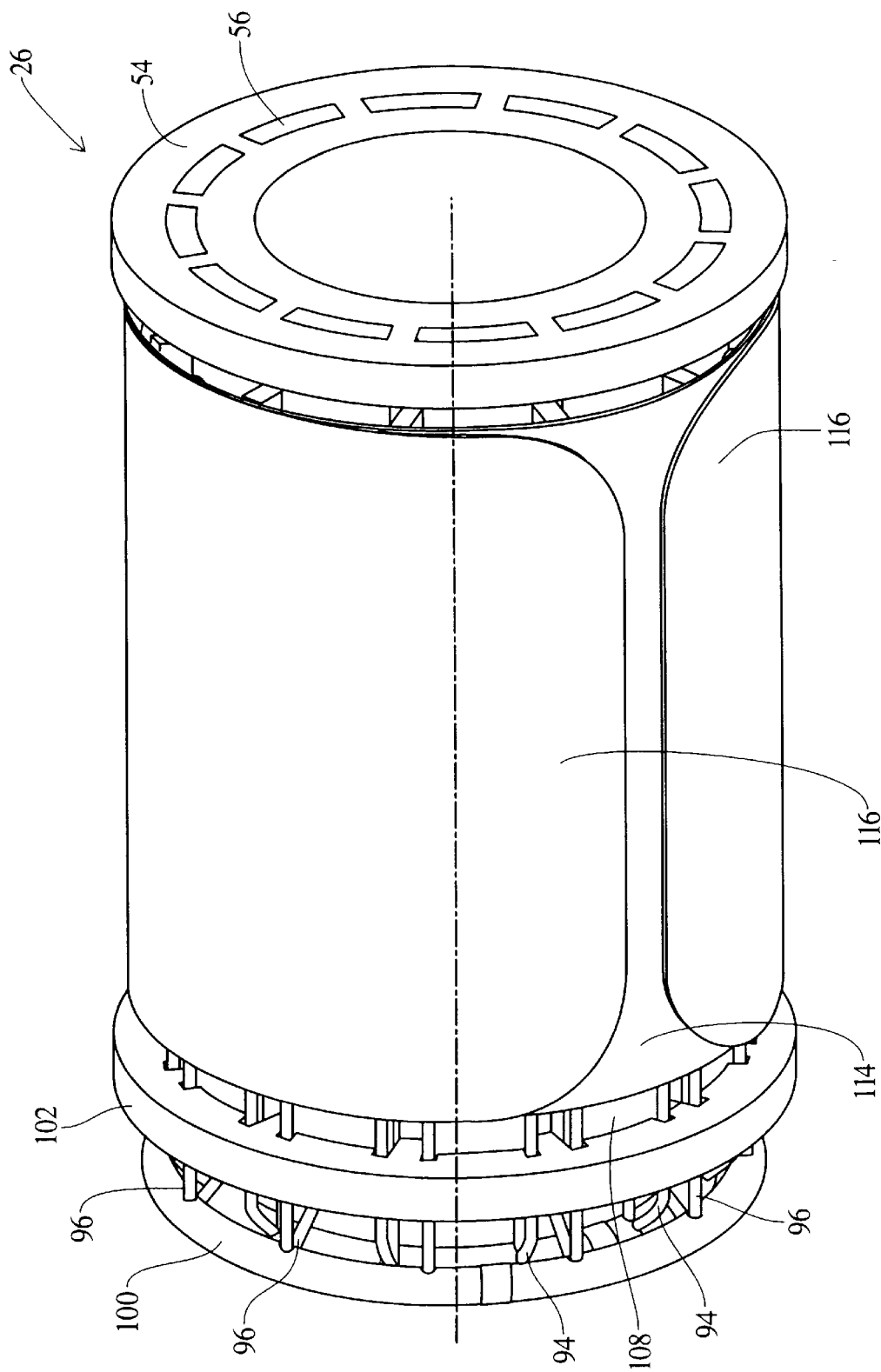
FIG. 8 is a perspective view of the self-shielded gradient coil assembly of FIG. 7 with a secondary x-gradient coil secured over the secondary z-gradient coil, and a secondary y-gradient coil secured over the secondary x-gradient coil.
Figure 9:
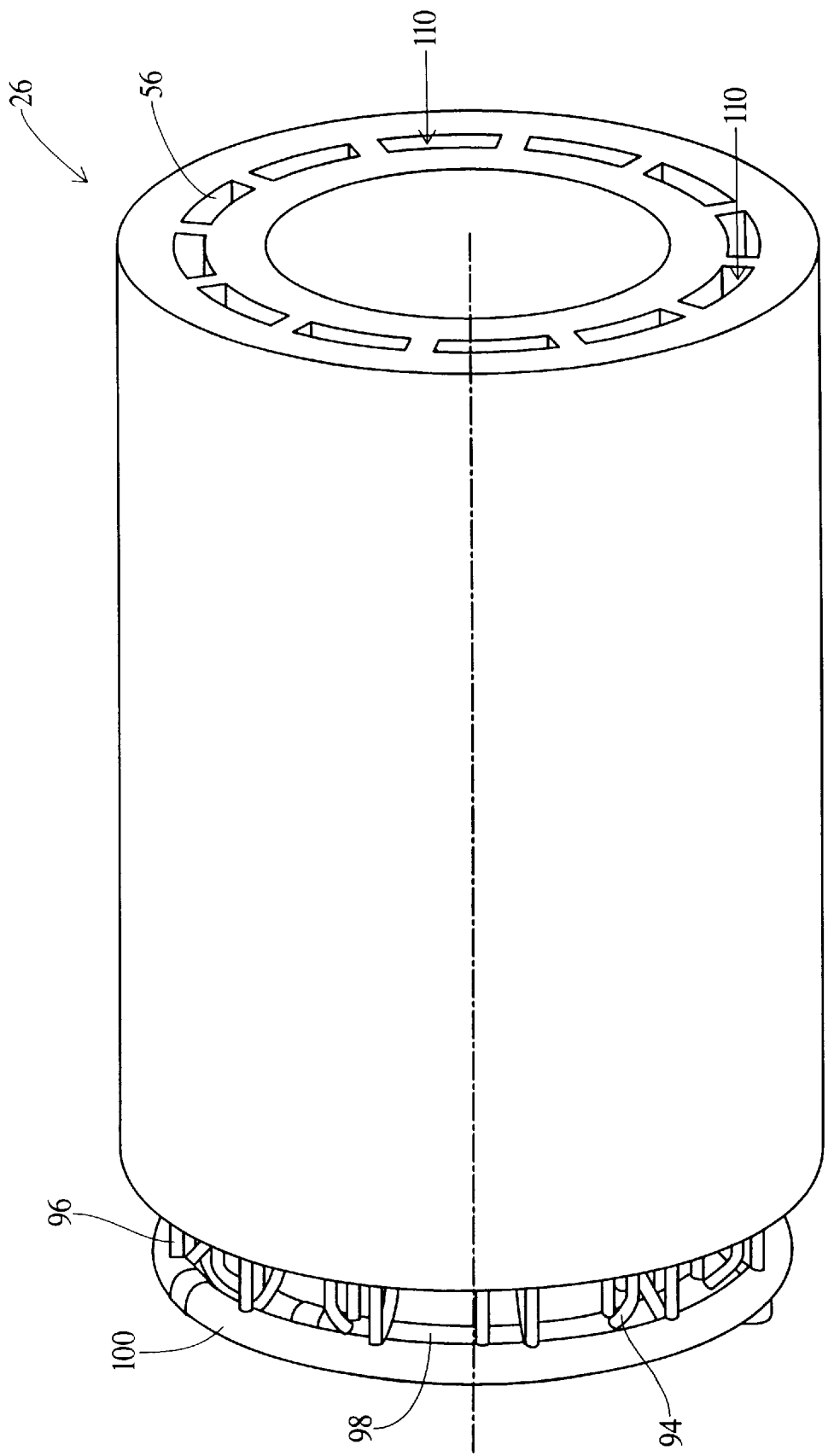
FIG. 9 is a perspective view of the fully-assembled and potted self-shielded gradient coil assembly in accordance with the first embodiment of the present invention.

Secondary or shielding z-gradient coil windings 112 are then wound into the grooves 88 of the combs 84. The embodiment being described incorporates a distributed z-gradient shielding coil design. As shown in FIGS. 2 and 8, a secondary or shielding x-gradient coil 114 and a secondary or shielding y-gradient coil 116 are temporarily spot bonded to the gradient coil assembly 26 over the windings 112. The secondary shielding coils 112, 114 are structurally similar to, and oriented in the same manner as the primary gradient coils 74, 76, as described above.

If the primary and secondary gradient coils are to be driven in series, the electrical interconnections are then made. A potting mold (not shown) is placed around the gradient coil assembly 26. A potting compound, such as epoxy, is drawn into and fills all voids within the gradient coil assembly in a single potting step. After the epoxy is cured and the potting mold removed, the shim tray molds 108 are removed through the apertures 56. The resulting cavities form the continuous channels or pockets 110 which extend from the service-end of the gradient coil assembly to the patient-end thereof. The channels 110 receive shim trays 118 which correct for limited non-uniformities of the primary magnetic field and render the primary magnetic field substantially uniform within the bore. The channels also provide air flow paths to promote cooling of the shim trays to minimize shim steel susceptibility changes.

Figure 10:
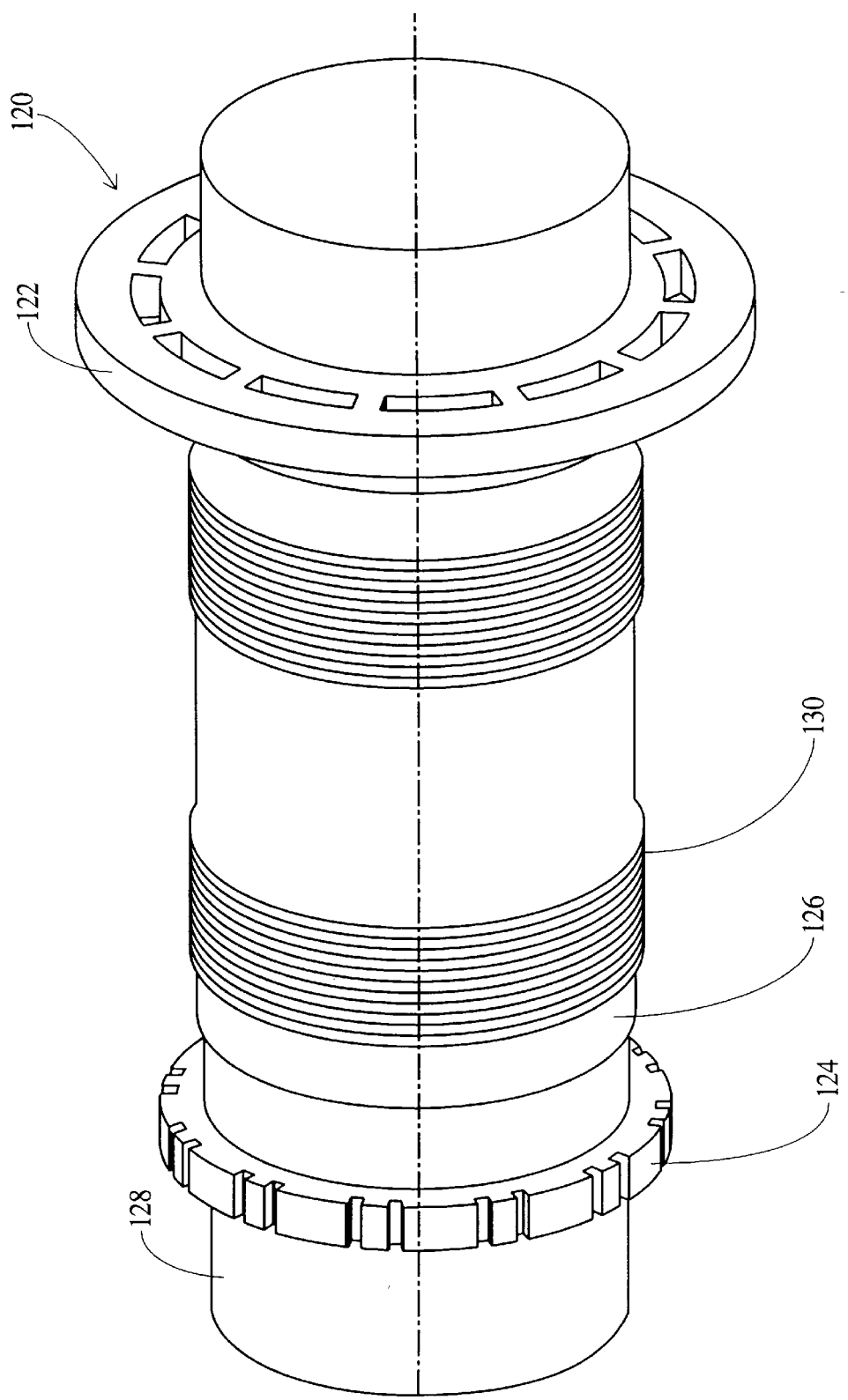
FIG. 10 is a perspective view of a partially assembled, self-shielded gradient coil assembly in accordance with a second embodiment of the present invention, wherein a primary z-gradient coil is wound over an RF ground screen that is temporarily secured to a removable mandrel.

Referring now to FIG. 10, a self-shielded gradient coil assembly 120 is manufactured without incorporating any filament wound tubes or formers. In particular, a first flange 122, a second flange 124, and an RF ground screen 126 are initially positioned over a removable mandrel 128. The removable mandrel with a highly polished surface has a slight taper from end to end to facilitate the subsequent removal after the final potting step is completed. A primary z-gradient coil 130 is then wound on the RF ground screen 126. The radial build-up of the gradient coil assembly 120 then continues in the same manner as described above in conjunction with FIGS. 4–9.

Thus, the self-shielded gradient coil assembly incorporates primary and shielding coils which are aligned and potted into a single, unitary construction. Because the primary and secondary assemblies are a unitary construction the axial alignment of the primary and secondary coils is built in within the mechanical tolerances of the machining equipment as the assembly is built. There is no need to perform an alignment procedure between separate primary and secondary gradient coil constructions. Thus, the prior art alignment process is eliminated: and the time required to perform the alignment is saved.

The invention has been described with reference to the preferred embodiments. Obviously, modifications and alterations will occur to others upon reading and understanding the preceding detailed description.

For instance, the order of the transverse (e.g., x- and y-gradient coils) and the axial (e.g., z-gradient coils may be varied or reversed. In addition, the inner cooling tubes 90 may be positioned between the former and the primary gradient coils, or positioned in any gap between the transverse and axial primary gradient coils. Likewise, the outer cooling tubes 92 may be positioned in any gap between the transverse and axial secondary gradient coils.

Further, the position of the combs 84, and the tooling for forming the notches 64, may be located from a surface other than the patient-end flange 54. Different bonding methods may be employed to secure the respective components to the gradient coil assembly. For instance, a heat cured epoxy and/or an epoxy which uses a catalytic agent, may be used.

It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly for inducing gradient magnetic fields across the temporally constant magnetic field, the self-shielded gradient coil assembly including;

a single former;

primary gradient coils supported by said former;

a plurality of combs extending from said former, the combs each having support means in a surface thereof;

a plurality of shielding gradient coils at least one of which is supported directly by the support means such that the shielding gradient coils are radially displaced from the primary gradient coils by the combs to define a passage therebetween; and the former, primary gradient coils, combs, and shielding gradient coils being encased together in a potting material to form a unitary construction.

2. The apparatus of claim 1, further including a plurality of channels defined within said passage; and a plurality of shim trays disposed in the channels.

3. The apparatus of claim 1, wherein said support means includes a plurality of notches, and said combs and said former are connected by a pin assembly which positions the notches, and hence and the at least one shielding gradient coil relative to the former.

4. A magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly for inducing gradient magnetic fields across the temporally constant magnetic field, the self-shielded gradient coil assembly including;

a single former;

primary gradient coils supported by said former;

a plurality of combs extending from said former, the combs each having notches in a surface thereof;

a plurality of shielding gradient coils at least one of which is supported directly in the notches such that the shielding gradient coils are radially spaced from the primary gradient coils;

a plurality of cooling tubes disposed between the primary and shielding coils; and the former, primary gradient coils, combs, shielding gradient coils, and cooling tubes being encased together in a potting material to form a unitary construction.

5. The apparatus of claim 4, wherein the cooling tubes each have an inlet connected to a supply manifold and an outlet connected to a return manifold.

6. A magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly for inducing gradient magnetic fields across the temporally constant magnetic field, the self-shielded gradient coil assembly including;

a single former;

primary gradient coils supported by said former;

a plurality of combs extending from said former, the combs each having notches in a surface thereof;

a plurality of shielding gradient coils at least one of which is supported directly in the notches such that the shielding gradient coils are radially spaced from the primary gradient coils by the combs to define a passage therebetween;

a plurality of inner cooling tubes positioned within said passage adjacent the primary gradient coils;

a plurality of outer cooling tubes positioned within said passage adjacent the secondary gradient coils; and a plurality of channels interposed between said inner and outer cooling tubes;

a plurality of shim trays disposed in the channels; and the former, primary gradient coils, combs, shielding gradient coils, inner cooling tubes, and outer cooling tubes being encased together in a potting material to form a unitary construction.

7. A magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly for inducing gradient magnetic fields across the temporally constant magnetic field, the self-shielded gradient coil assembly including;

a single former having a Plurality of grooves on a surface thereof;

primary z-gradient coils supported directly in the grooves;

primary x- and y-gradient coils supported by said former;

a plurality of combs extending from said former, the combs each having notches in a surface thereof;

a plurality of shielding gradient coils at least one of which is supported directly in the notches such that the shielding gradient coils are radially spaced from the primary gradient coils by the combs to define a passage therebetween; and the former, primary gradient coils, combs, and shielding gradient coils being encased together in a potting material to form a unitary construction.

8. A magnetic resonance imaging system comprising:

an annular vacuum chamber which defines a cylindrical inner bore therein;

an annular helium reservoir disposed within the vacuum chamber surrounding and displaced from the central bore thereof;

a superconducting primary magnetic field coil disposed within the helium chamber for generating a substantially uniform magnetic field longitudinally through the central bore;

a self-shielded gradient coil assembly disposed in the central bore for generating gradient magnetic fields across a central region thereof and for shielding the vacuum chamber, the helium reservoir, and other components within the vacuum chamber from the generated gradient field magnetic fields such that eddy currents are not induced in the vacuum chamber or the contained associated structure, which eddy currents would tend to generate spurious magnetic fields within the bore, the self-shielded gradient coil assembly including a plurality of primary gradient coils, a plurality of spacers supported by the primary gradient coils, and a plurality of shield gradient coils, the spacers each having notches in a surface thereof and at least one of the shield gradient coils being directly supported in the notches, and the primary gradient coils, spacers, and shield gradient coils being encased together in a potting compound to form a unitary construction in which the primary gradient coils are spaced from the shield gradient coils to form a passage therebetween;

a radio frequency coil disposed within a bore of the former;

a scan control which selectively causes electrical pulses to be applied to the x, y, and z-primary and shield gradient coils;

a radio frequency transmitter which applies radio frequency pulses to the radio frequency coil for exciting and manipulating magnetic resonance of selected dipoles within the examination region;

a receiver which receives and demodulates magnetic resonance signals emanating from the examination region; and a reconstruction processor which reconstructs the demodulated magnetic resonance signals into an image representation.

9. A magnetic resonance imaging system comprising:

a vacuum chamber which defines a central bore therein;

a helium reservoir disposed within the vacuum chamber surrounding and displaced from the central bore thereof;

a superconducting primary magnetic field coil disposed within the helium chamber for generating a substantially uniform magnetic field longitudinally through the central bore;

a self-shielded gradient coil assembly disposed in the central bore for generating gradient magnetic fields across a central region thereof and for shielding the vacuum chamber, the helium reservoir, and other components within the vacuum chamber from gradient field magnetic fields, the self-shielded gradient coil assembly including a plurality of primary gradient coils, a plurality of spacers supported by the primary gradient coils, and a plurality of shield gradient coils, the spacers each having notches in a surface thereof and at least one of the shield gradient coils being directly supported in the notches, and the primary gradient coils, spacers, and shield gradient coils being encased together in a potting compound to form a unitary construction in which the primary gradient coils are spaced from the shield gradient coils to form a passage; and a plurality of cooling tubes encased in the passage between the primary and shield gradient coils.

10. The apparatus of claim 9, wherein each of said plurality of cooling tubes includes an inlet connected to a supply manifold and an outlet connected to a return manifold.

11. The apparatus of claim 8 further including a cylindrical former on which the primary gradient coils are supported, the cylindrical former being encased within the unitary construction.

12. A magnetic resonance imaging system comprising:

a vacuum chamber which defines a central bore therein;

a helium reservoir disposed within the vacuum chamber surrounding and displaced from the central bore thereof;

a superconducting primary magnetic field coil disposed within the helium chamber for generating a substantially uniform magnetic field longitudinally through the central bore;

a self-shielded gradient coil assembly disposed in the central bore for generating gradient magnetic fields across a central region thereof and for shielding the vacuum chamber, the helium reservoir, and other components within the vacuum chamber from gradient field magnetic fields, the self-shielded gradient coil assembly including a plurality of primary gradient coils, a plurality of spacers supported by the primary gradient coils, and a plurality of shield gradient coils, the spacers each having notches in a surface thereof and at least one of the shield gradient coils being directly supported in the notches, and the primary gradient coils, spacers, and shield gradient coils being encased together in a potting compound to form a unitary construction in which the primary gradient coils are spaced from the shield gradient coils to form a passage therebetween; and a plurality of channels defined within the passage for removably receiving shim trays.

13. The apparatus of claim 12, further including:

a plurality of inner cooling tubes positioned between the primary gradient coils and the channels; and a plurality of outer cooling tubes positioned between the shield gradient coils and the channels.

14. A magnetic resonance imaging system comprising:

a vacuum chamber which defines a central bore therein;

a helium reservoir disposed within the vacuum chamber surrounding and displaced from the central bore thereof;

a superconducting primary magnetic field coil disposed within the helium chamber for generating a substantially uniform magnetic field longitudinally through the central bore;

a self-shielded gradient coil assembly disposed in the central bore for generating gradient magnetic fields across a central region thereof and for shielding the vacuum chamber, the helium reservoir, and other components within the vacuum chamber from gradient field magnetic fields, the self-shielded gradient coil assembly including:

a plurality of primary gradient coils;

a plurality of shield gradient coils;

a single resin and fiber cylindrical former on which the primary gradient coils are supported;

resin spacers supported by the former and the primary gradient coils, the spacers each including a plurality of notches in a surface thereof, at least one of the shield gradient coils being directly supported by the notches in a spaced relationship relative to the primary gradient coils; and the former, the primary gradient coils, the spacers, and the shield gradient coils being encased together in resin to form a unitary construction.

15. A method of manufacturing a self-shielded gradient coil assembly comprising:

supporting a plurality of primary gradient coils to a cylindrical former;

supporting a plurality of comb-like spacers on the former, the spacers each having alignment means on a surface thereof;

supporting a plurality of shield gradient coils to the spacers, at least one of the shield gradient coils being directly supported by the alignment means; and potting the former, the primary gradient coils, the spacers and the shield gradient coils in resin to form a unitary construction.

16. The method of claim 15, further including:

before the potting step, positioning a plurality of cooling tubes between the primary gradient coils and the shield gradient coils such that the cooling tubes are potted in the resin to become a part of the unitary construction.

17. The method of claim 15, further including:

before the potting step, positioning a plurality of shim tray molds between the primary gradient coils and the shield gradient coils; and after the potting step, removing the shim tray molds to define channels in the unitary construction suitable for receiving shim trays.

18. The method of claim 15, further including:

before the potting step, positioning a plurality of inner cooling tubes and outer cooling tubes between the primary gradient coils and the shield gradient coils; and positioning a plurality of elongated molds between the inner cooling tubes and the outer cooling tubes.

19. The method of claim 15, further including:

defining alignment structures in the former, the spacers, and the primary and shield gradient coils to facilitate aligning the shield gradient coils with the primary gradient coils.

20. The method of claim 15, wherein the alignment means includes a plurality of notches.

21. A method of manufacturing a self-shielded gradient coil assembly comprising:

positioning a plurality of primary gradient coils over a cylindrical mandrel;

positioning a plurality of spacers over the cylindrical mandrel and the primary gradient coils;

mounting a plurality of shield gradient coils to the spacers;

potting the primary gradient coils, the spacers, and the shield gradient coils in resin to form a unitary structure; and separating the cylindrical mandrel from the unitary structure to form a central subject receiving bore.

* * * * *